US012727083B2

(12) United States Patent
Jang

(10) Patent No.: US 12,727,083 B2
(45) Date of Patent: Sep. 1, 2026

(54) DISPLAY DEVICE

(71) Applicant: Samsung Display Co., Ltd., Yongin-si (KR)

(72) Inventor: Joo-Nyung Jang, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 257 days.

(21) Appl. No.: 18/623,699

(22) Filed: Apr. 1, 2024

(65) Prior Publication Data

US 2024/0397617 A1 Nov. 28, 2024

(30) Foreign Application Priority Data

May 26, 2023 (KR) ........................ 10-2023-0068689

(51) Int. Cl.
*H05K 1/00* (2006.01)
*H05K 1/11* (2006.01)
*H05K 5/00* (2006.01)

(52) U.S. Cl.
CPC ........... *H05K 1/111* (2013.01); *H05K 5/0069* (2013.01); *H05K 2201/09409* (2013.01); *H05K 2201/09427* (2013.01); *H05K 2201/10128* (2013.01); *H05K 2201/10984* (2013.01)

(58) Field of Classification Search
CPC ................. H05K 1/111; H05K 5/0069; H05K 2201/09409; H05K 2201/09427; H05K 2201/10128; H05K 2201/10984
See application file for complete search history.

(56) References Cited

U.S. PATENT DOCUMENTS

| | | | | |
|---|---|---|---|---|
| 11,456,349 | B2 | 9/2022 | Hong et al. | |
| 2021/0066828 | A1* | 3/2021 | Woo | H01R 12/62 |
| 2022/0352290 | A1 | 11/2022 | Park et al. | |

FOREIGN PATENT DOCUMENTS

| | | | | |
|---|---|---|---|---|
| CN | 114374101 A | * | 4/2022 | H01R 43/00 |
| KR | 10-2020-0080889 | | 7/2020 | |
| KR | 10-2021-0005350 | | 1/2021 | |
| KR | 20210005350 A | * | 1/2021 | H05K 3/323 |
| KR | 10-2021-0086900 | | 7/2021 | |
| KR | 20210086900 A | * | 7/2021 | H01L 23/4985 |
| WO | WO-2018124804 A1 | * | 7/2018 | H05K 3/1258 |

* cited by examiner

*Primary Examiner* — Pete T Lee
(74) *Attorney, Agent, or Firm* — Innovation Counsel LLP

(57) ABSTRACT

A display device includes a circuit board including a plurality of circuit pads, a display panel including a plurality of pad areas and a plurality of non-pad areas alternately arranged in a direction, and a conductive adhesive member that electrically connects the circuit board to the display panel. The display panel further includes a base layer including a plurality of openings, which overlap the plurality of non-pad areas in a plan view, respectively, a light transmission layer disposed in each of the plurality of openings and having a light transmittance greater than a light transmittance of the base layer, and a plurality of display pads which correspond to the plurality of circuit pads and are arranged in the direction to overlap the plurality of pad areas in a plan view, respectively.

18 Claims, 12 Drawing Sheets

DP
DP-OLED
DP-CL
TFL
OPN
PDL
60
CNT-3
50
40
30
20
10
BFL
BL
CNT-2
CNT-1
SCL
CNE1
CNE2
NPXA
PXA
DP-DA
OLED
CE
ECL
EML
HCL
AE
UE
D2
A2
S2
G2
TR2
D1
A1
S1
G1
TR1
DR1
DR2
DR3

DISPLAY DEVICE

CROSS-REFERENCE TO RELATED APPLICATION(S)

This application claims priority to and benefits of Korean Patent Application No. 10-2023-0068689 under 35 U.S.C. § 119, filed on May 26, 2023, in the Korean Intellectual Property Office (KIPO), the entire contents of which are incorporated herein by reference.

BACKGROUND

1. Technical Field

The disclosure herein relates to a display device having improved bonding reliability between a display panel and a circuit board.

2. Description of Related Art

Display devices such as televisions, monitors, smart phones, and tablets that provide images to a user include display panels that display images. Various display panels such as liquid crystal display panels, organic light emitting display panels, electro wetting display panels, and electrophoretic display panels are being developed as the display panel.

Recently, a display device including a flexible display panel has been developed with the development of display devices. The display panel includes multiple pixels displaying an image and a driving circuit for driving the pixels. To realize a thin display device, pixels may be disposed on a display area of a display panel, and the circuit board on which driving circuits are mounted may be connected to a non-display area of the display panel.

SUMMARY

The disclosure provides a display device having improved bonding reliability.

In an embodiment of the disclosure, a display device may include a circuit board including a plurality of circuit pads, a display panel including a plurality of pad areas and a plurality of non-pad areas alternately arranged in a direction, and a conductive adhesive member that electrically connects the circuit board to the display panel. In an embodiment, the display panel may further include a base layer including a plurality of openings, which overlap the plurality of non-pad areas in a plan view, respectively, a light transmission layer disposed in each of the plurality of openings and having a light transmittance greater than a light transmittance of the base layer, and a plurality of display pads which correspond to the plurality of circuit pads and are arranged in the direction to overlap the plurality of pad areas in a plan view, respectively.

In an embodiment, the plurality of openings may be arranged in the direction and not overlap the plurality of pad areas in a plan view.

In an embodiment, the light transmission layer may be in direct contact with an opening surface of the base layer, which defines the plurality of openings.

In an embodiment, the light transmission layer may be filled in the plurality of openings.

In an embodiment, the base layer may further include a first barrier layer disposed below the display pads, and a first sub base layer disposed below the first barrier layer. In an embodiment, the first barrier layer may be disposed to overlap the plurality of pad areas and the plurality of non-pad areas in a plan view, and the first sub base layer may include first openings arranged to respectively overlap the plurality of non-pad areas in a plan view.

In an embodiment, the light transmission layer may be filled in the first openings.

In an embodiment, the base layer may further include a second barrier layer disposed below the first sub base layer, and a second sub base layer disposed below the second barrier layer. In an embodiment, the second barrier layer may be disposed to overlap the plurality of pad areas and the plurality of non-pad areas in a plan view, and the second sub base layer may include second openings corresponding to the first openings.

In an embodiment, the light transmission layer may be filled in the second openings.

In an embodiment, each of the first sub base layer and the second sub base layer may include a polyimide (PI) material.

In an embodiment, the light transmission layer may include a polymer material that transmits ultraviolet light.

In an embodiment, the light transmission layer may have the light transmittance in a range of about 80% to about 95%.

In an embodiment, a pitch of each of the plurality of display pads in the direction and a pitch of each of the plurality of circuit pads in the direction may be same.

In an embodiment, a width of each of the plurality of display pads in the direction may be less than a width of each of the plurality of circuit pads in the direction.

In an embodiment, the conductive adhesive member may include a photoinitiator.

In an embodiment of the disclosure, a display device may include a circuit board including a plurality of circuit pads, a display panel including a plurality of pad areas arranged in a first direction and extending in a second direction intersecting the first direction and a non-pad area adjacent to the plurality of pad areas, and a conductive adhesive member that electrically connects the circuit board to the display panel. In an embodiment, the display panel may further include a base layer including a plurality of layers and an opening defined in at least one of the plurality of layers, a light transmission layer disposed in the opening and having a light transmittance greater than a light transmittance of the base layer, and a plurality of display pads which correspond to the plurality of circuit pads and arranged in the first direction to overlap the plurality of pad areas in a plan view, respectively.

In an embodiment, the non-pad area may include a plurality of non-pad areas, and the plurality of non-pad areas and the plurality of pad areas may be alternatively arranged in the first direction.

In an embodiment, the plurality of layers may include a first barrier layer disposed below the display pads, and a first sub base layer disposed below the first barrier layer. In an embodiment, the first barrier layer may be disposed to overlap the plurality of pad areas and the plurality of non-pad areas in a plan view, and the first sub base layer may include first openings arranged to respectively overlap the plurality of non-pad areas in a plan view.

In an embodiment, the light transmission layer may be filled in the first openings.

In an embodiment, the base layer may further include a second barrier layer disposed below the first sub base layer, and a second sub base layer disposed below the second barrier layer. In an embodiment, the second barrier layer may be disposed to overlap the plurality of pad areas and the plurality of non-pad areas in a plan view, and the second sub base layer may include second openings corresponding to the first openings.

In an embodiment, the light transmission layer may be filled in the second openings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings.

DETAILED DESCRIPTION OF THE EMBODIMENTS

Figure 1:
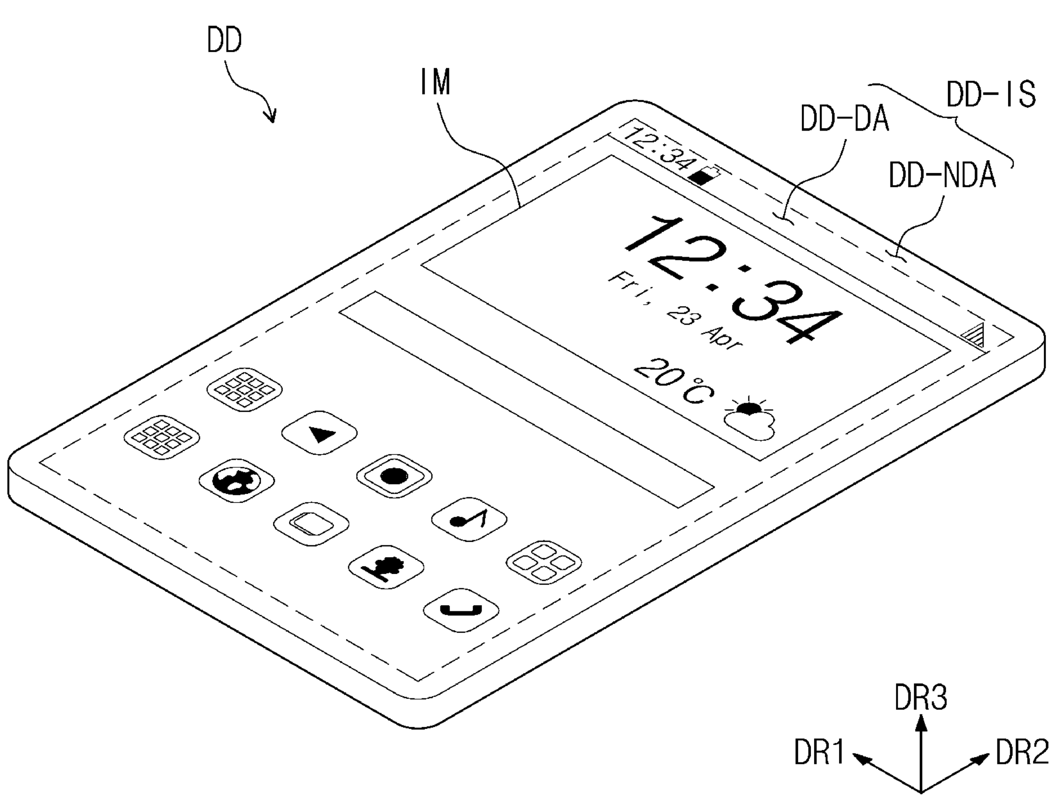
FIG. 1 is a perspective view of a display device according to an embodiment of the disclosure.

Since the disclosure may have diverse modified embodiments, specific embodiments are illustrated in the drawings and are described in the detailed description of the disclosure. However, this does not limit the disclosure within specific embodiments and it should be understood that the disclosure covers all the modifications, equivalents, and replacements within the idea and technical scope of the disclosure.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

Like reference numerals refer to like elements throughout. Also, in the figures, the thickness, ratio, and dimensions of components are exaggerated for clarity of illustration.

In the specification and the claims, the phrase "at least one of" is intended to include the meaning of "at least one selected from the group of" for the purpose of its meaning and interpretation. For example, "at least one of A and B" may be understood to mean "A, B, or A and B." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will be understood that although the terms such as 'first' and 'second' are used herein to describe various elements, these elements should not be limited by these terms. These terms are used only to distinguish one component from other components. For example, a first element referred to as a first element in an embodiment can be referred to as a second element in another embodiment without departing from the scope of the appended claims. The terms of a singular form may include plural forms unless referred to the contrary.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described with reference to the accompanying drawings.

Figure 2A:
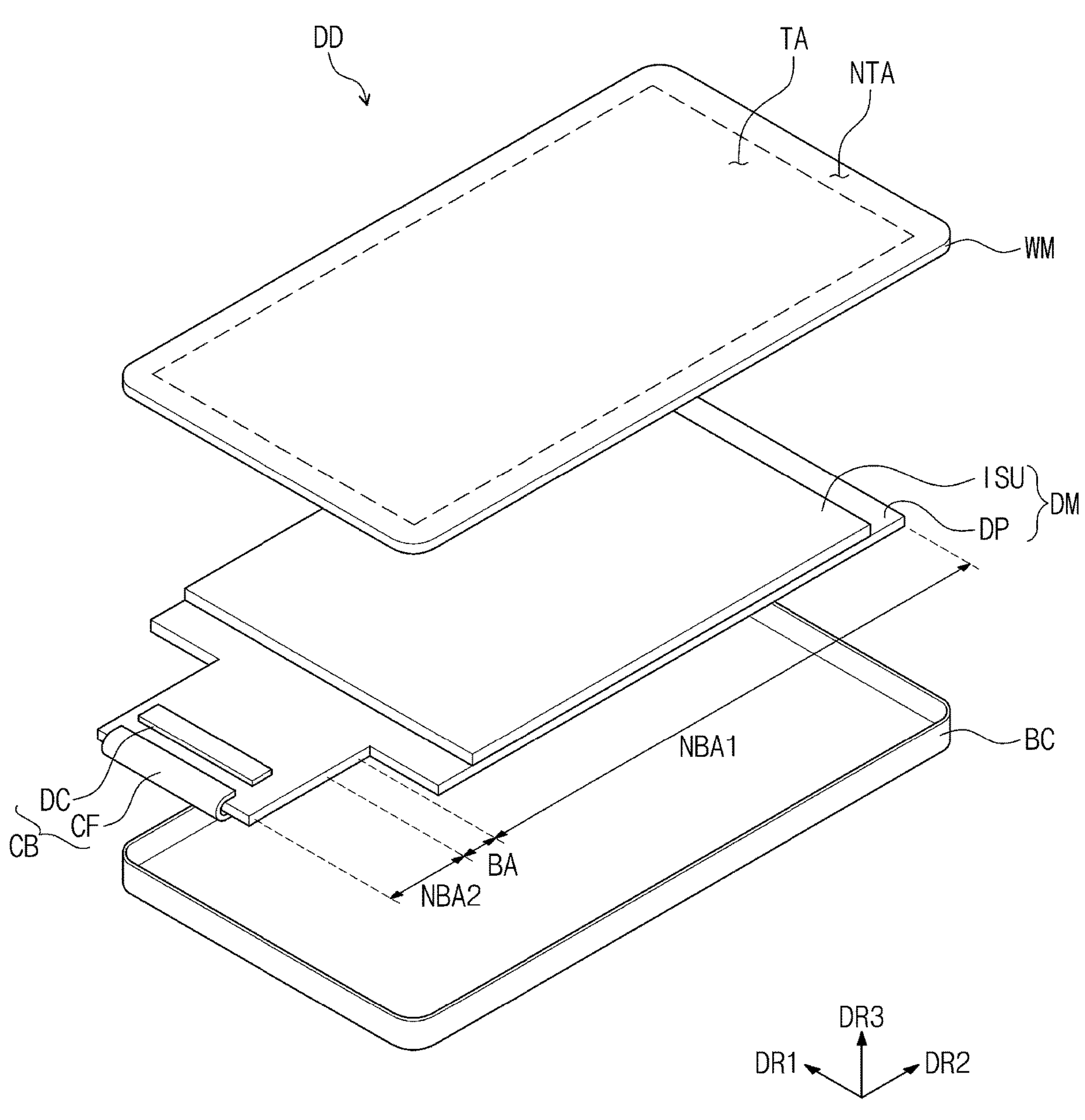
FIG. 2A is an exploded perspective view of the display device according to an embodiment of the disclosure.
Figure 2B:
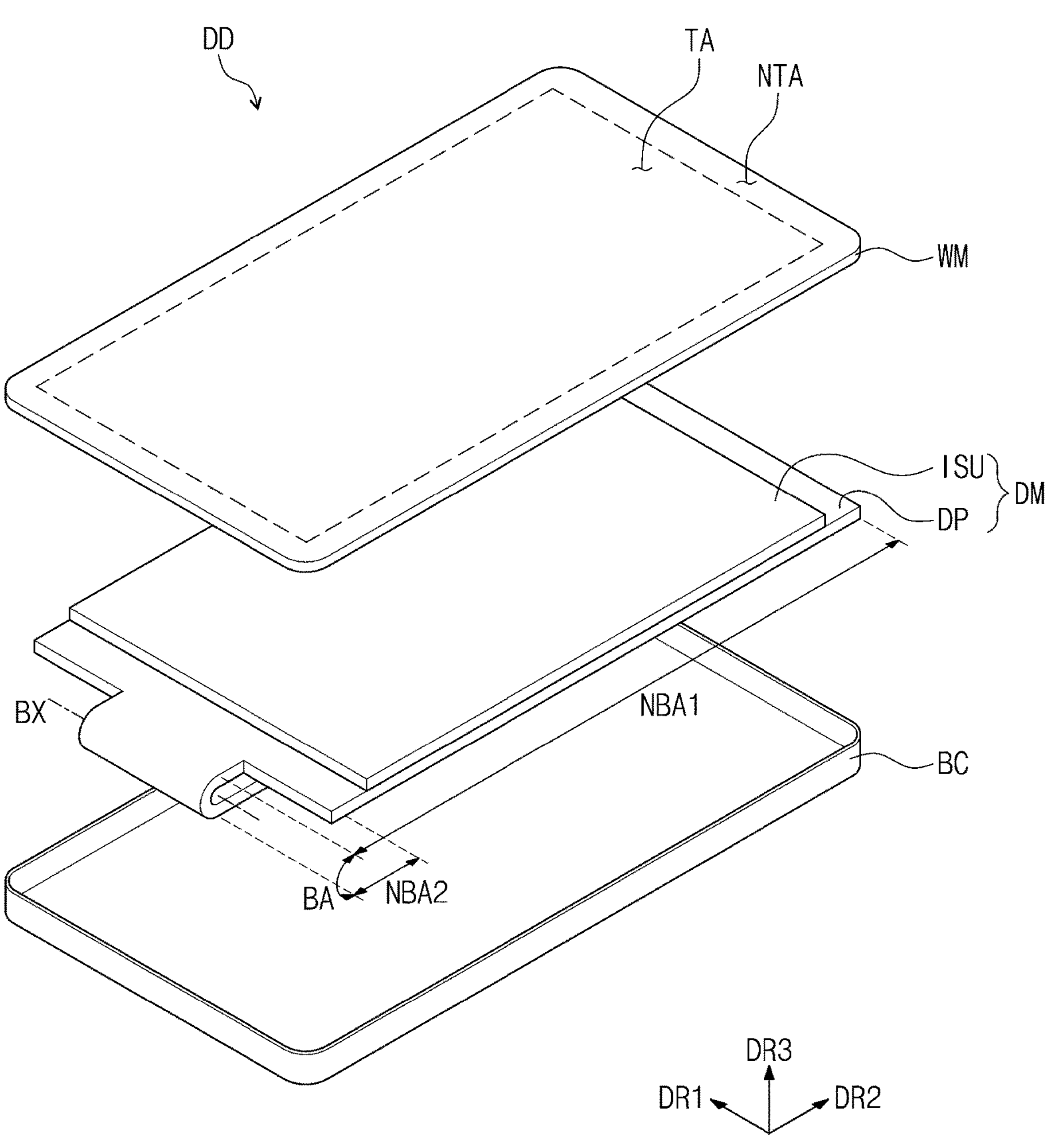
FIG. 2B is an exploded perspective view of the display device according to an embodiment of the disclosure.

FIG. 1 is a perspective view of a display device according to an embodiment of the disclosure. FIGS. 2A and 2B are exploded perspective views of the display device according to an embodiment of the disclosure. FIG. 2B schematically illustrates a state in which a display panel DP of a display device DD is bent. In this specification, a mobile phone terminal is illustrated as an embodiment of the display device ED. However, the disclosure is not limited thereto, and the display device DD according to an embodiment of the disclosure may be applied to large-sized electronic devices such as televisions and monitors and small and middle-sized electronic devices such as tablet PC, navigation units for vehicles, game consoles, and smart watch.

Referring to FIG. 1, a display device DD may display an image IM through a display surface DD-IS. Icon images are illustrated as an example of the image IM. The display surface DD-IS may be parallel to a surface defined by a first direction DR1 and a second direction DR2. A normal direction of the display surface DD-IS, i.e., a thickness direction of the display device DD may be indicated a third direction DR3.

The display surface DD-IS may include a display area DD-DA on which an image IM is displayed and a non-display area DD-NDA that is adjacent to the display area DD-DA. The non-display area DD-NDA may be an area on which an image is not displayed. However, the disclosure is not limited thereto. The non-display area DD-NDA may be adjacent to a side of the display area DD-DA or be omitted.

In this specification, "when viewed on the plan view" "on the plane" or "in a plan view" may mean a case when viewed in the third direction DR3. A front surface (or a top surface) and a rear surface (or a bottom surface) of each of layers or units, which will be described below, may be distinguished by the third direction DR3. However, the combination of the first to third directions DR1, DR2, and DR3 may be changed to another combination.

Referring to FIGS. 2A and 2B, the display device DD may include a window WM, a display module DM, and a storage member BC.

The window WM may be disposed above the display module DM to transmit an image provided from the display module DM to the outside. The window WM may include a transmission area TA and a non-transmission area NTA. The transmission area TA may have a shape that overlaps the display area DD-DA illustrated in FIG. 1 in a plan view to correspond to the display area DD-DA. The window WM may include a base layer and functional layers disposed on the base layer. The functional layers may include a protective layer, an anti-fingerprint layer, and the like. The base layer of the window WM may be made of glass, sapphire, or plastic. The base layer of the window WM may include an optically transparent insulating material. For example, the base layer of the window WM may include glass or plastic. The base layer of the window WM may have a single layer or multilayered structure. For example, the base layer of the window WM may include multiple plastic films bonded to each other by using an adhesive or include a glass substrate and a plastic film, which are bonded to each other by using an adhesive.

The non-transmission area NTA may have a shape that overlaps the non-display area DD-NDA in a plan view to correspond to the non-display area DD-NDA. The non-transmission area NTA may be an area having a light transmittance that is relatively less than a light transmittance of the transmission area TA. The non-transmissive area NTA may be defined by disposing a bezel pattern on a partial area of the base layer of the window WM, and an area on which the bezel pattern is not disposed may be defined as the transmissive area TA. However, the disclosure is not limited thereto, and the non-transmission area NTA may be omitted.

Although not shown in the drawings, an antireflection layer may be disposed between the window WM and the display module DM. The antireflection layer may reduce reflectance of external light incident from the outside of the display device DD. The antireflection layer may include color filters. The color filters may have an arrangement. For example, the color filters may be arranged in consideration of emission colors of the pixels provided in the display panel DP to be described below. The antireflection layer may further include a black matrix adjacent to the color filters.

According to an embodiment of the disclosure, the display module DM may include a display panel DP and an input sensor ISU.

The display panel DP may be an emissive display panel and include one of a liquid crystal display panel, an electrophoretic display panel, a microelectromechanical system (MEMS) display panel, an electrowetting display panel, an organic light emitting display panel, an inorganic light emitting display panel, and a quantum dot light emitting display panel. However, the disclosure is not particularly limited thereto. Hereinafter, an organic light emitting display panel is described as an embodiment of the display panel DP.

The input sensor ISU may include one of a capacitive sensor, an optical sensor, an ultrasonic sensor, and an electromagnetic induction sensor. The input sensor ISU may be formed on the display panel DP through a continuous process or may be separately manufactured and attached to an upper side of the display panel DP through an adhesive layer, but the disclosure is not limited thereto.

The display module DM may include a circuit board CB. The circuit board CB may include a driving chip DC and a printed circuit board CF. Although FIG. 2A illustrates an embodiment in which the driving chip DC is mounted on the display panel DP, the disclosure is not limited thereto. The driving chip DC may generate a driving signal that is necessary for an operation of the display panel DP based on a control signal transmitted from the circuit board CF.

The display panel DP may include a bending area BA and first and second non-bending areas NBA1 and NBA2, which are spaced apart from each other in the second direction DR2 with the bending area BA between the first and second non-bending areas NBA1 and NBA2.

The bending area BA may be defined as an area on which the display panel DP is bent around a virtual bending axis BX extending in the first direction DR1. The first non-bending area NBA1 may be an area overlapping the transmission area TA in a plan view, and the second non-bending area NBA2 may be defined as an area to which the printed circuit board CF is connected. In case that the bending area BA is bent with respect to the bending axis BX, the printed circuit board CF and the driving chip DC may be bent in a direction toward a rear surface of the display panel DP and disposed below the rear surface of the display panel DP. Although not shown in the drawings, additional elements may be disposed to compensate for a height difference between the circuit board CB and the rear surface of the display panel DP, which is caused by the bending area BA.

According to an embodiment, a width of the first non-bending area NBA1 in the second direction DR2 may be greater than a width of each of the bending area BA and the second non-bending area NBA2 in the second direction DR2. However, the disclosure is not limited thereto, and the width of the bending area BA in the second direction DR2 may be provided in a shape that is gradually narrowed from the first non-bending area NBA1 to the second non-bending area NBA2.

As a portion of the display panel DP is bent as illustrated in FIG. 2B, the printed circuit board CF electrically bonded to the display panel DP may be disposed on the rear surface of the display panel DP.

The storage member BC may accommodate the display module DM and be coupled to the window WM. The printed circuit board CF may be disposed on an end of the display panel DP and may be electrically connected to the circuit element layer DP-CL. Although not shown in the drawings, the display device DD may further include a main board, electronic modules mounted on the main board, a camera module, and a power module.

Although the display device DD has been described as a mobile phone terminal, in this specification, the display device DD may include two or more electrically bonded electronic components. The display panel DP and the driving chip DC mounted on the display panel DP may correspond to different electronic components, respectively, and the display device DD may be configured with only these components, and the disclosure is not limited to any one embodiment.

In an embodiment, the display device DD may be configured only with the display panel DP and the printed circuit board CF connected to the display panel DP, and the display device DD may be configured with only the main board and the electronic module mounted on the main board. Hereinafter, the display device DD according to the disclosure will be described based on a bonding structure between the display panel DP and the driving chip DC mounted on the display panel DP.

Figure 3:
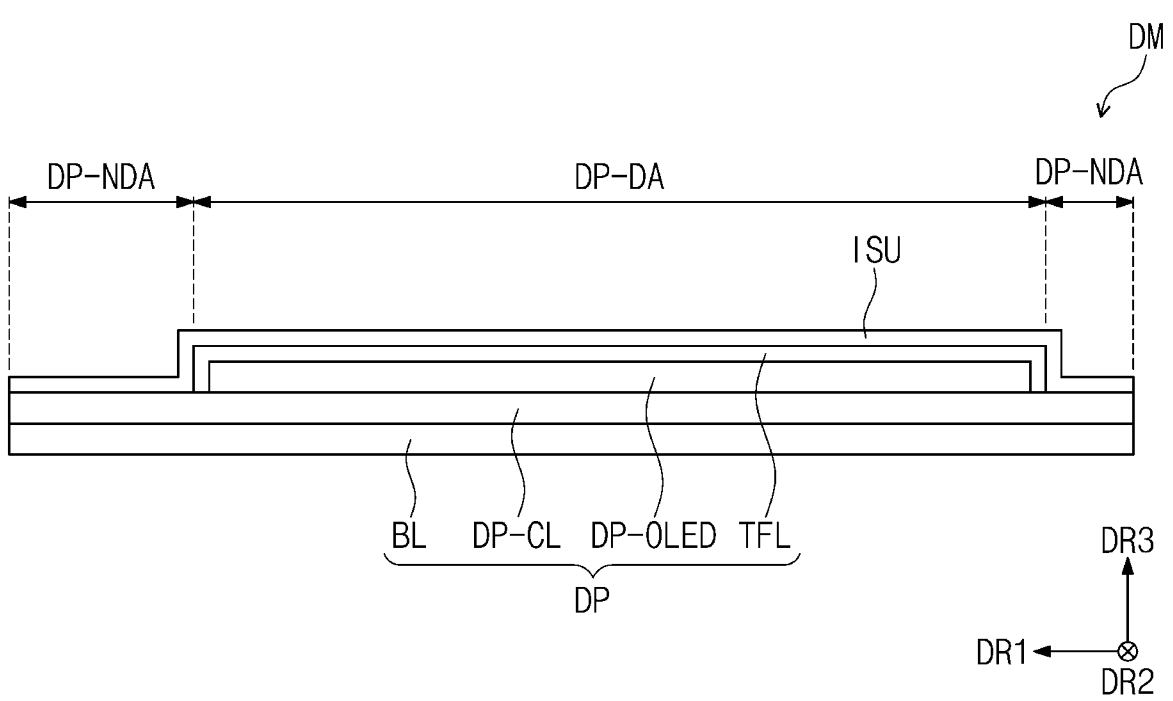
FIG. 3 is a schematic cross-sectional view of a display module according to an embodiment of the disclosure.
Figure 4:
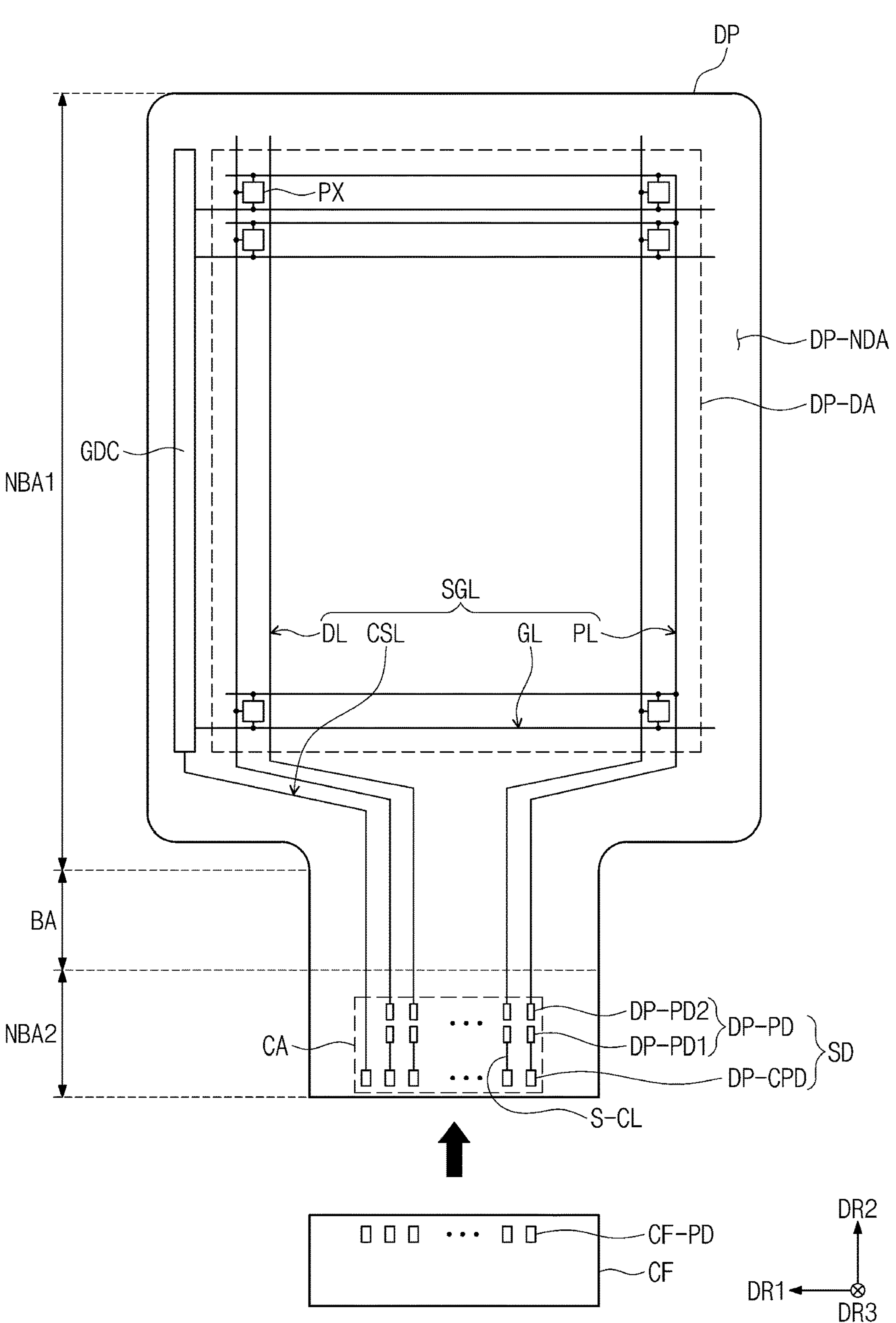
FIG. 4 is a plan view illustrating a partial configuration of the display device according to an embodiment of the disclosure.

FIG. 3 is a schematic cross-sectional view of the display module according to an embodiment of the disclosure. FIG. 4 is a plan view illustrating a partial configuration of the display device according to an embodiment of the disclosure.

Referring to FIG. 3, the display panel DP may include a base layer BL, a circuit element layer DP-CL disposed on the base layer BL, a display element layer DP-OLED, and an upper insulating layer TFL. The input sensor ISU may be disposed on the upper insulating layer TFL.

The display panel DP may include a display area DP-DA and a non-display area DP-NDA. The display area DP-DA of the display panel DP may correspond to the display area DD-DA of FIG. 2A or the transmission area TA of FIG. 2A, and the non-display area DP-NDA may correspond to the non-display area DD-NDA of FIG. 1 or the non-transmission area NTA of FIG. 2A.

The base layer BL may include at least one plastic film. The base layer BL may include a plastic substrate, a glass substrate, a metal substrate, or an organic/inorganic composite substrate as a flexible substrate.

The circuit element layer DP-CL may include at least one intermediate insulating layer and a circuit element. The intermediate insulating layer may include at least one intermediate inorganic layer and at least one intermediate organic layer. The circuit element may include signal lines, a driving circuit of a pixel, and the like.

The display element layer DP-OLED may include multiple organic light emitting diodes. The display element layer DP-OLED may further include an organic layer such as a pixel defining layer.

The upper insulating layer TFL may seal the display element layer DP-OLED. The upper insulating layer TFL may be disposed on the display element layer DP-OLED. The upper insulating layer SGL may overlap the display area DP-DA and the non-display area DP-NDA in a plan view. The upper insulating layer TFL may overlap at least a portion of the non-display area DP-NDA in a plan view. For example, the upper insulating layer TFL may be a thin film encapsulation layer. The thin film encapsulation layer may include a laminated structure of an inorganic layer/an organic layer/an inorganic layer. The upper insulating layer TFL may protect the display element layer DP-OLED against foreign substances such as moisture, oxygen, and dust particles. However, the disclosure is not limited thereto, and the upper insulating layer TFL may further include an additional insulating layer in addition to the thin film encapsulation layer. For example, the upper insulating layer TFL may further include an optical insulating layer for controlling a refractive index.

In an embodiment of the disclosure, an encapsulation substrate may be provided in place of the upper insulating layer TFL. The encapsulation substrate may face the base layer BL, and the circuit element layer DP-CL and the display element layer DP-OLED may be disposed between the encapsulation substrate and the substrate SUB.

The input sensor ISU may be disposed (e.g., directly disposed) on the display panel DP. In this specification, that "a constituent A is directly disposed on a constituent B" may mean that a separate layer is not disposed between the constituents A and B. In an embodiment, the input sensor ISU may be manufactured with the display panel DP through a continuous process. However, the disclosure is not limited thereto. For example, the input sensor ISU may be provided as an individual panel and be coupled to the display panel DP by an adhesive layer. In an embodiment, the input sensor ISU may be omitted.

Referring to FIG. 4, the display panel DP may include multiple pixels PX, a gate driving circuit GDC, multiple signal lines SGL, and multiple pads DP-PD and DP-CPD.

The pixels PX may be disposed on the display area DP-DA. Each of the pixels PX may include an organic light emitting diode and a pixel driving circuit connected to the organic light emitting diode. The gate driving circuit GDC and the signal lines SGL may be included in the circuit element layer DP-CL illustrated in FIG. 3.

The gate driving circuit GDC may sequentially output gate signals to the gate lines GL. The gate driving circuit GDC may include multiple thin film transistors that are manufactured through a same process as the driving circuit of the pixel PX, e.g., a low temperature polycrystalline silicon (LTPS) process or a low temperature polycrystalline oxide (LTPO) process. The display panel DP may further include another driving circuit that provides emission control signals to the pixels PX.

The signal lines SGL may include gate lines GL, data lines DL, a power line PL, and a control signal line CSL. The gate lines GL may be respectively connected to corresponding pixel of the pixels PX, and the data lines DL may be respectively connected to corresponding pixel PX of the pixels PX. The power line PL may be connected to the pixels PX. The control signal line CSL may provide control signals to the scan driving circuit.

The signal lines SGL may overlap the display area DP-DA and the non-display area DP-NDA in a plan view. Each of the signal lines SGL may include a pad part and a line part. The line part may overlap the display area DP-DA and the non-display area DP-NDA in a plan view. The pad part may be connected to an end of the line part. The pad part may overlap a pad area to be described below in a plan view.

The display panel DP may include multiple display pads SD. The display pads LD may be spaced a distance from each other. The display pads SD according to an embodiment may be disposed to overlap the second non-bending area NBA2 in a plan view. The display pads SD may be disposed in a connection area CA of the second non-bending area NBA2. The connection area CA may be an area of the second non-bending area NBA2, on which the display pads SD are disposed, and may be defined as an area to which the driving chip DC (see FIG. 2A) and the printed circuit board CF are attached.

The display pads SD may include first pads DP-PD and second pads DP-CPD. The first pads DP-PD may be disposed to overlap the connection area CA in a plan view. The driving chip DC (see FIG. 2A) may be mounted on the second non-bending area NBA2. The first pads DP-PD may be electrically connected to the driving chip DC to transmit an electrical signal received from the driving chip DC to the signal lines SGL.

The first pads DP-PD may be arranged in the first and second directions DR1 and DR2. The first pads DP-PD may include first row pads DP-PD1 and second row pads DP-PD2 spaced apart from the first row pads DP-PD1 in the second direction DR2 and arranged in the first direction DR1. The second row pads DP-PD2 may be input pads that receive signals from the driving chip DC, and the first row pads DP-PD1 may be output pads that transmits signals to the driving chip DC.

However, the disclosure is not limited thereto, and the first pads DP-PD may be arranged in one row or three or more rows in the second direction DR2.

The second pads DP-CPD may be disposed to overlap the connection area CA in a plan view. The second pads DP-CPD may be arranged in the first direction DR1. The first pads DP-PD and the second pads DP-CPD may be connected to each other through bridge signal lines S-CL.

The second pads DP-CPD may also include row pads arranged in the first direction DR1 like the first pads DP-PD. The pads in one row may include second pads DP-CPD arranged apart from each other in the first direction DR1.

The printed circuit board CF may include substrate pads CF-PD electrically connected to the display panel DP. The substrate pads CF-PD may be arranged in the first direction DR1. In case that the second pads DP-CPD are provided in the form of row pads arranged in the first direction DR1, the substrate pads CF-PD included in the circuit board CF may also arranged in one-to-one corresponding to the second pads DP-CPD, but the disclosure is not limited thereto.

The second pads DP-CPD may be electrically connected to the substrate pads CF-PD included in the printed circuit board CF to transmit electrical signals received from the printed circuit board CF to the first pads DP-PD. The printed circuit board CF may be rigid or flexible. For example, in case that the printed circuit board CF is flexible, the printed circuit board CF may be provided as a flexible printed circuit board.

The printed circuit board CF may include a timing control circuit that controls an operation of the display panel DP. The timing control circuit may be mounted on the printed circuit board CF in the form of an integrated chip. Also, although not shown in the drawings, the printed circuit board CF may include an input sensing circuit for controlling the input sensor ISU.

Although the display panel DP of the disclosure is described as having a structure including the first pads DP-PD for mounting the driving chip DC illustrated in FIG. 2A, the disclosure is not limited thereto. The driving chip DC may be mounted on the printed circuit board CF, and the first pads DP-PD may be omitted.

Figure 5:
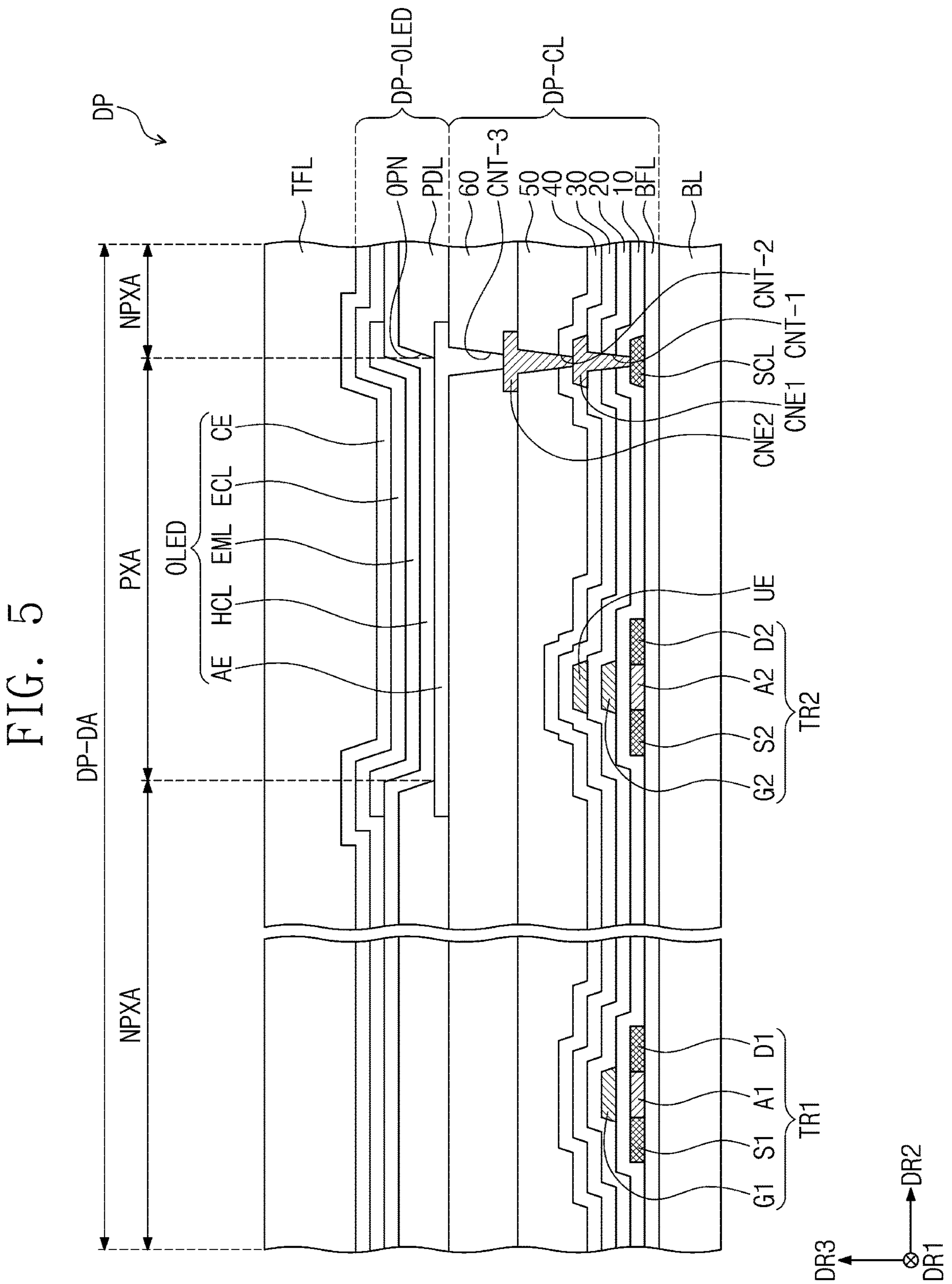
FIG. 5 is a schematic cross-sectional view of a display panel according to an embodiment of the disclosure.

FIG. 5 is a schematic cross-sectional view of a display panel according to an embodiment of the disclosure.

Referring to FIG. 5, the display area DP-DA may include an emission area PXA and a non-emission area NPXA. Each of the pixels PX may include an organic light emitting diode OLED and a pixel driving circuit connected to the organic light emitting diode OLED. For example, the pixel PX may include a first transistor T1, a second transistor T2, and an organic light emitting diode OLED. Two of the transistors TR1 and TR2 in the pixel driving circuit are illustrated in FIG. 5.

The display panel DP may include multiple insulating layers, a semiconductor pattern, a conductive pattern, a signal line, and the like. The insulating layer, the semiconductor layer, and the conductive layer may be formed by coating, deposition, or the like. Thereafter, the insulating layer, the semiconductor layer, and the conductive layer may be selectively patterned in a photolithography process. The semiconductor pattern, the conductive pattern, and the signal line, which are provided in the circuit element layer DP-CL and the display element layer DP-OLED, may be formed in the above-described manner.

The base layer BL may include a synthetic resin film. The base layer BL may have a multi-layered structure. For example, the base layer BL may have a three-layer structure of a synthetic resin layer, an inorganic layer, and a synthetic resin layer. For example, the synthetic resin layer may be a polyimide resin layer, and the material thereof is not particularly limited. The base layer BL may include a glass substrate, a metal substrate, and an organic/inorganic composite substrate.

At least one inorganic layer may be disposed on a top surface of the base layer BL. The inorganic layer may be provided as a multilayer. The multilayered inorganic layer may constitute a barrier layer and/or a buffer layer. In this embodiment, the display panel DP is illustrated as including a buffer layer BFL.

The semiconductor pattern may be disposed on the buffer layer BFL. The semiconductor pattern may include polysilicon. However, the disclosure is not limited thereto. For example, the semiconductor pattern may include amorphous silicon or a metal oxide.

FIG. 5 illustrates merely a portion of the semiconductor pattern. For example, the semiconductor pattern may be further disposed on other areas of the pixel PX on the plane. The semiconductor pattern may be arranged in a pattern over pixels. The semiconductor pattern may have different electrical properties depending on whether the semiconductor pattern is doped. The semiconductor pattern may include a first area and a second area. The first area may be doped with an N-type dopant or a P-type dopant. A P-type transistor may include a doped region into which the P-type dopant is doped.

The first area may have conductivity greater than conductivity of the second area and may substantially serve as an electrode or a signal line. The second area may have a low doping concentration or may be a non-doped region and may substantially correspond to an active (or channel) of the transistor. For example, a portion of the semiconductor pattern may be an active of the transistor, another portion may be a source or drain of the transistor, and the other portion may be a connection electrode or a connection signal line.

As illustrated in FIG. 5, a first source S1, a first active A1, and a first drain D1 of a first transistor TR1 may be formed from the semiconductor pattern, and a second source S2, a second active A2, and a second drain D2 of the second transistor TR2 may be formed from the semiconductor pattern.

FIG. 5 schematically illustrates a portion of a connection signal line SCL formed from the semiconductor pattern. Although not particularly shown, the connection signal line SCL may be electrically connected to the second drain D2 of the second transistor T2. Another transistor may be disposed between the connection signal line SCL and the second drain D2 of the second transistor TR2.

A first insulating layer 10 may be disposed on the buffer layer BFL. The first insulating layer 10 may commonly overlap the pixels PX and cover the semiconductor pattern. First and second gates G1 and G2 may be disposed on the first insulating layer 10. Each of the first and second gates G1 and G2 may be a portion of the metal pattern. The first gate G1 may overlap the first active A1 in a plan view, and the second gate G2 may overlap the second active A2 in a plan view. In a process of doping the semiconductor pattern, the first and second gates G1 and G2 may serve as masks.

A second insulating layer 20 covering the first and second gates G1 and G2 may be disposed on the first insulating layer 10. The second insulating layer 20 may commonly overlap the pixels PX in a plan view. An upper electrode UE may be disposed on the second insulating layer 20. The upper electrode UE may overlap the second gate G2 of the second transistor TR2 in a plan view. The upper electrode UE may be a portion of the metal pattern. A portion of the second gate G2 and the upper electrode UE overlapping the portion of the second gate G2 may constitute a capacitor.

A third insulating layer 30 covering the upper electrode UE may be disposed on the second insulating layer 20. The first connection electrode CNE1 disposed on the third insulating layer 30 may be connected to the signal line SCL through a contact hole CNT-1 passing through the first to third insulating layers 10 to 30.

A fourth insulating layer 40 covering the first connection electrode CNE1 may be disposed on the third insulating layer 30. The first insulating layer 10 to the fourth insulating layer 40 may include an inorganic layer and/or an organic layer and have a single-layered or multilayered structure.

The fifth insulating layer 50 may be disposed on a fourth insulating layer 40. The fifth insulating layer 50 may be an organic layer. A second connection electrode CNE2 may be disposed on the fifth insulating layer 50. The second connection electrode CNE2 may be connected to the first connection electrode CNE1 through a contact hole CNT-2 passing through the fourth insulating layer 40 and the fifth insulating layer 50.

A sixth insulating layer 60 covering the second connection electrode CNE2 may be disposed on the fifth insulating layer 50. The sixth insulating layer 60 may be an organic layer. A first electrode AE may be disposed on the sixth insulating layer 60. The first electrode AE may be connected to the second connection electrode CNE2 through a contact hole CNT-3 passing through the sixth insulating layer 60.

A pixel opening OPN may be defined in the pixel defining layer PDL. The pixel opening OPN of the pixel defining layer PDL may expose at least a portion of the first electrode AE. In an embodiment, the emission area PXA may be defined to correspond to a portion of an area of the first electrode AE exposed by the pixel opening OPN.

A hole control layer HCL may be commonly disposed in the emission area PXA and the non-emission area NPXA. The hole control layer HCL may include a hole transport layer and may further include a hole injection layer. The emission layer EML may be disposed on the hole control layer HCL. The emission layer EML may be disposed on an area corresponding to the pixel opening OPN. For example, the emission layer EML may be formed separately for each of the pixels PX. However, the disclosure is not limited thereto, and the emission layer EML may be commonly provided in the pixels PX using an open mask.

An electronic control layer ECL may be disposed on the emission layer EML. The electron control layer ECL may include an electron transport layer and may further include an electron injection layer. The hole control layer HCL and the electron control layer ECL may be commonly formed in the pixels by using an open mask. The second electrode CE may be disposed on the electron control layer ECL. The second electrode CE may be provided as a single body and commonly disposed on the pixels PX. An upper insulating layer TFL may be disposed on the second electrode CE. The upper insulating layer TFL may include multiple thin films.

Figure 6:
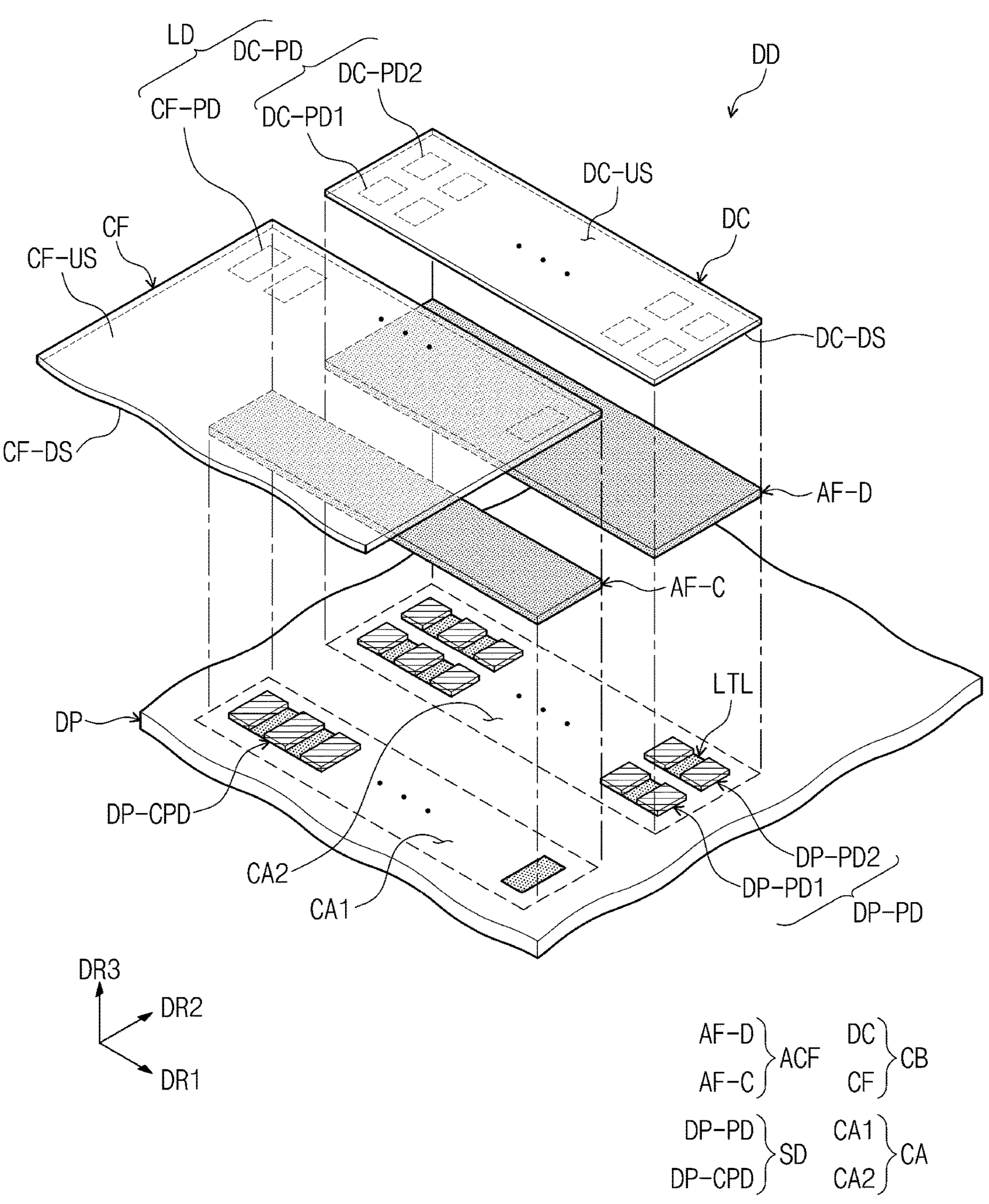
FIG. 6 is an exploded perspective view illustrating a portion of the display device according to an embodiment of the disclosure.

FIG. 6 is an exploded perspective view illustrating a portion of the display device according to an embodiment of the disclosure.

Referring to FIG. 6, the display device DD may include a circuit board CB, a conductive adhesive member ACF, and a display panel DP. FIG. 6 schematically illustrates that, for convenience of description, the display panel DP, the conductive adhesive member ACF, and the circuit board CB are disassembled to be spaced apart from each other, but the display panel DP, the conductive adhesive member ACF, and the circuit board CB may be coupled to each other. For example, at least some components of the display panel DP may be in contact with the conductive adhesive member ACF, and at least some components of the circuit board CB may be in contact with the conductive adhesive member ACF.

The circuit board CB may include a printed circuit board CF and a driving chip DC. The circuit board CB may include multiple circuit pads LD, and the circuit pads LD may be spaced a distance from each other. The circuit pads LD may include substrate pads CF-PD mounted on the printed circuit board CF and chip pads DC-PD mounted on the driving chip DC.

The conductive adhesive member ACF may be disposed between the circuit board CB and the display panel DP. The conductive adhesive member ACF may electrically connect the circuit pads LD to the display pads SD. According to an embodiment of the disclosure, the conductive adhesive member ACF may include a photoinitiator. The conductive adhesive member ACF may include a first conductive adhesive member AF-C disposed between the printed circuit board CF and the display panel DP and a second conductive adhesive member AF-D disposed between the driving chip DC and the display panel DP. The connection area CA on which the display panel DP and the circuit board CB are connected to each other may include a first connection area CAL on which the printed circuit board CF and the display panel DP are connected to each other and a second connection area CA2 on which the driving chip DC and the display panel DP are connected to each other.

The printed circuit board CF may include a top surface CF-US and a bottom surface CF-DS. The bottom surface CF-DS of the printed circuit board CF may be a surface facing the display panel DP. The substrate pads CF-PD may be disposed on the bottom surface CF-DS of the printed circuit board CF and may be electrically connected to the second pads DP-CPD of the display panel DP, respectively. The substrate pads CF-PD and the second pads DP-CPD may be electrically connected to each other through the first conductive adhesive member AF-C.

The driving chip DC may include a top surface DC-US and a bottom surface DC-DS. The bottom surface DC-DS of the driving chip DC may be a surface that faces the display panel DP. The driving chip DC may include chip pads DC-PD electrically connected to the first pads DP-PD disposed on the base layer BL. The chip pads DC-PD and the first pads DP-PD may be electrically connected to each other through the second conductive adhesive member AF-D.

The chip pads DC-PD may include first row chip pads DC-PD1 arranged in the first direction DR1 and second row chip pads DC-PD2 spaced apart from the first row chip pads DC-PD1 in the second direction DR2 and arranged in the first direction DR1. Each of the first row chip pads DC-PD1 and the second row chip pads DC-PD2 may have a shape that is exposed from the bottom surface of the driving chip DC to the outside. The first row chip pads DC-PD1 may be electrically connected to the first row pads DP-PD1 of the first pads DP-PD to receive first signals, transmit second signals generated based on the first signals from the second row chip pads DC-PD2 to the second row pads DP-PD2, and provide the second signals to the data line DL (see FIG. 4) through the second row pads DP-PD2. Although the chip pads DC-PD are described as being arranged in two rows in FIG. 6, the disclosure is not limited thereto, and the chip pads DC-PD may be arranged in a single row or multiple rows based on the structure in which the first pads DP-PD are arranged.

The display panel DP may further include a light transmission layer LTL disposed between the display pads SD. The light transmission layer LTL may be disposed to overlap the connection area CA in a plan view. The light transmission layer LTL may be disposed to overlap the first connection area CA1 and the second connection area CA2 in a plan view. The display pads SD and the light transmission layer LTL may be alternately arranged in a direction. The light transmission layer LTL may be disposed in openings OP (see FIG. 7B) defined in the base layer BL. Details related to this structure will be described below.

Figure 7A:
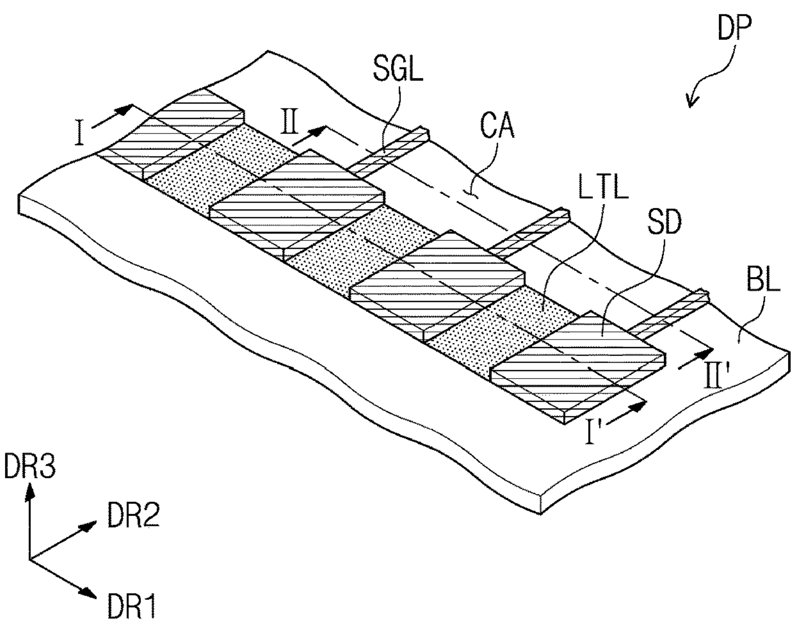
FIG. 7A is a perspective view illustrating a portion of the display panel according to an embodiment of the disclosure.
Figure 7B:
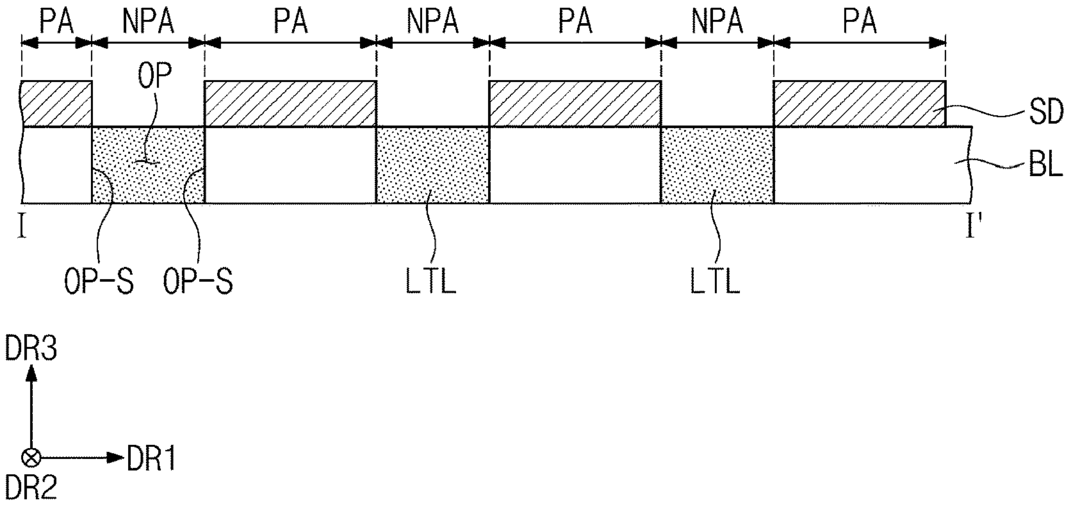
FIG. 7B is a schematic cross-sectional view taken along line I-I' of FIG. 7A.
Figure 7C:
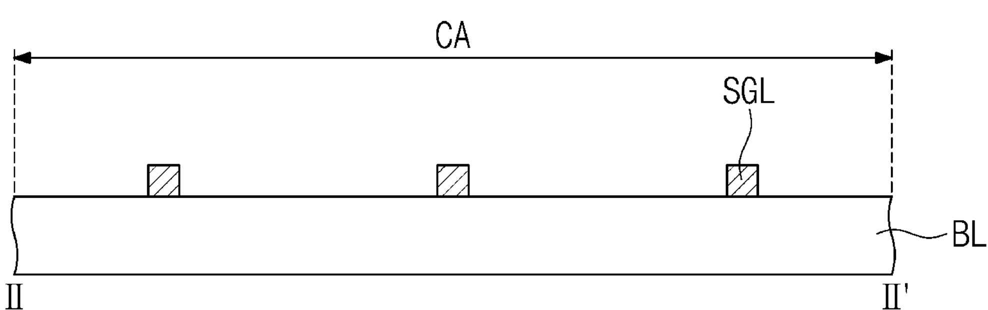
FIG. 7C is a schematic cross-sectional view taken along line II-II' of FIG. 7A.

FIG. 7A is a perspective view illustrating a portion of the display panel according to an embodiment of the disclosure. FIG. 7B is a schematic cross-sectional view taken along line I-I' of FIG. 7A. FIG. 7C is a schematic cross-sectional view taken along line II-II' of FIG. 7A. Particularly, FIG. 7A is an enlarged view of a portion of the first connection area CA1 or the second connection area CA2, which are illustrated in FIG. 6.

Referring to FIGS. 7A and 7B, the display panel DP may include a base layer BL including multiple openings OP, a light transmission layer LTL disposed in each of the openings OP, and display pads SD disposed on the base layer BL. The display pads SD illustrated in FIGS. 7A and 7B may represent any of the above-described first pads DP-PD (see FIG. 6) and the above-described second pads DP-CPD (see FIG. 6). Between the display pads SD are the first pads DP-PD or the second pads DP-CPD, the arrangement directions of the signal lines SGL may be different from each other. The light transmission layer LTL and the display pads SD may be disposed to overlap the connection area CA in a plan view. The connection area CA illustrated in FIG. 7A may be one of the first connection area CAL and the second connection area CA2, which are illustrated in FIG. 6, and will be described hereinafter as the connection area CA for convenience.

The connection area CA may include multiple pad areas PA and multiple non-pad areas NPA. The pad areas PA and the non-pad areas NPA may be alternately defined in a direction. The non-pad areas NPA may be spaced apart from each other in the first direction DR1 with each pad area PA between the non-pad areas NPA.

The display pads SD may be arranged on the base layer BL to overlap the pad areas PA in a plan view, respectively. The openings OP may be defined to overlap the non-pad areas NPA in a plan view, respectively. The display pads SD may be arranged to entirely overlap the pad areas PA in a plan view, respectively. The openings OP may be defined to entirely overlap each of the non-pad areas NPA in a plan view, respectively. Thus, the base layer BL may include a structure in which the display pads SD and the openings OP are alternately arranged in a direction.

Each of the openings OP may be a hole defined in the base layer BL. For example, each of the openings OP may be a through-hole defined by passing through the base layer BL. The light transmission layer LTL may be disposed in each of the openings OP. During forming the light transmission layer LTL, a separate base film may be disposed under the light transmission layer LTL to form the light transmission layer LTL, and the base film may be removed. The light transmission layer LTL may overlap the non-pad areas NPA and may not overlap the pad areas PA in a plan view.

According to an embodiment of the disclosure, the light transmission layer LTL may have a light transmittance greater than a light transmittance of the base layer BL. For example, the light transmission layer LTL may have a light transmittance greater than or equal to about 60%. For example, in case that ultraviolet (UV) light having a wavelength in a range of about 300 nm to about 400 nm is provided, the light transmission layer LTL may transmit in a range of about 80% to about 95% of light. The light transmission layer LTL may include a polymer material capable of transmitting ultraviolet (UV) light. For example, the light transmission layer LTL may include at least one of cycloolefin-based derivatives, cellulose-based polymers, ethylene-vinyl acetate-based copolymers, polyester-based polymers, polystyrene-based polymers, polyamide-based polymers, polyamideimide polymers, polyetherimide polymers, polyacrylic polymers, polyimide polymers, polyethersulfone polymers, polysulfone polymers, polyethylene polymers, polypropylene polymers, polymethylpentene polymers, polyvinyl chloride polymers, polyvinylidene chloride polymers, polyvinyl alcohol polymers, polyvinyl acetal polymers, polyether ketone polymers, polyether ether ketone polymers, polymethyl methacrylate polymers, polyethylene terephthalate-based polymers, polybutylene terephthalate-based polymers, polyethylene naphthalate-based polymers, polycarbonate-based polymers, polyurethane-based polymers, and epoxy-based polymers.

For example, in case that the ultraviolet (UV) light having a wavelength in a range of about 300 nm to about 400 nm is provided, the light transmission layer LTL may include at least one of polyacrylic polymers, polysilicone polymers, polyimide polymers, polymethyl methacrylate polymers, polycarbonate polymers, polymethyl methacrylate-based polymers, polystyrene-based polymers, polyethylene terephthalate-based polymers, polypropylene-based polymers, polyethylene-based polymers, which are capable of transmitting at least about 60% of light.

The light transmission layer LTL may be disposed to be in direct contact with the opening surfaces OP-S defining the openings OP. The light transmission layer LTL may be disposed to be entirely filled into the openings OP. For example, the light transmission layer LTL and the openings OP may have a same shape. As illustrated in the drawings, each of the openings OP may have a quadrangular or rectangular parallelepiped shape extending or shortened in the first or second direction DR1 or DR2. Thus, the light transmission layer LTL and each of the opening OP may have a same quadrangular or rectangular parallelepiped shape. However, the disclosure is not limited thereto, and the light transmission layer LTL and the openings OP may have various shapes as needed.

As illustrated in FIG. 7B, in an embodiment of the disclosure, the light transmission layer LTL may overlap a portion of the conductive adhesive member ACF (see FIG. 6) disposed on the display pads SD in a plan view. Thus, during manufacturing the display device DD (see FIG. 1) according to an embodiment of the disclosure, light provided to the display device DD may pass through the light transmission layer LTL having high light transmittance and be provided to the conductive adhesive member ACF (see FIG. 6).

The display pads SD and the openings OP may be alternately arranged in the first direction DR1. The display pads SD may be spaced a distance from each other, and the openings OP may be spaced a distance from each other. The distance between the display pads SD may be substantially equal to a width of each of the openings OP in the first direction DR1, and the distance between the openings OP may be substantially equal to a width of each of the display pads SD in the first direction DR1. The width of each of the display pads SD in the second direction DR2 and the width of each of the openings OP in the second direction DR2 may be substantially the same. In the specification, "substantially the same" includes not only a case in which the widths and thicknesses of the components are physically completely the same, but also a case in which there is a difference by an error range occurring in process in spite of the same design.

Referring to FIGS. 7A and 7C, the display panel DP may include multiple display pads SD and multiple signal lines SGL, which are connected to the display pads SD, respectively.

The signal lines SGL may be connected to the display pads SD to transmit electrical signals, respectively. The signal lines SGL may be disposed on the base layer BL to overlap the connection area CA in a plan view. The signal lines SGL may be spaced apart from the light transmission layer LTL in a plan view. The signal lines SGL may be arranged in the first direction DR1 and may have a structure connected in the second direction DR2 intersecting the first direction DR1 to the display pads SD.

Figure 8A:
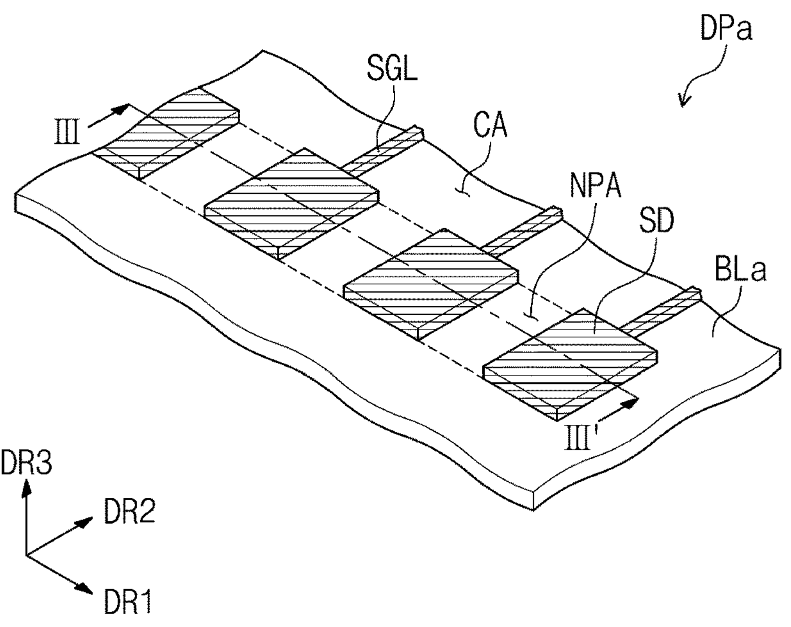
FIG. 8A is a perspective view illustrating a portion of the display panel according to an embodiment of the disclosure.
Figure 8B:
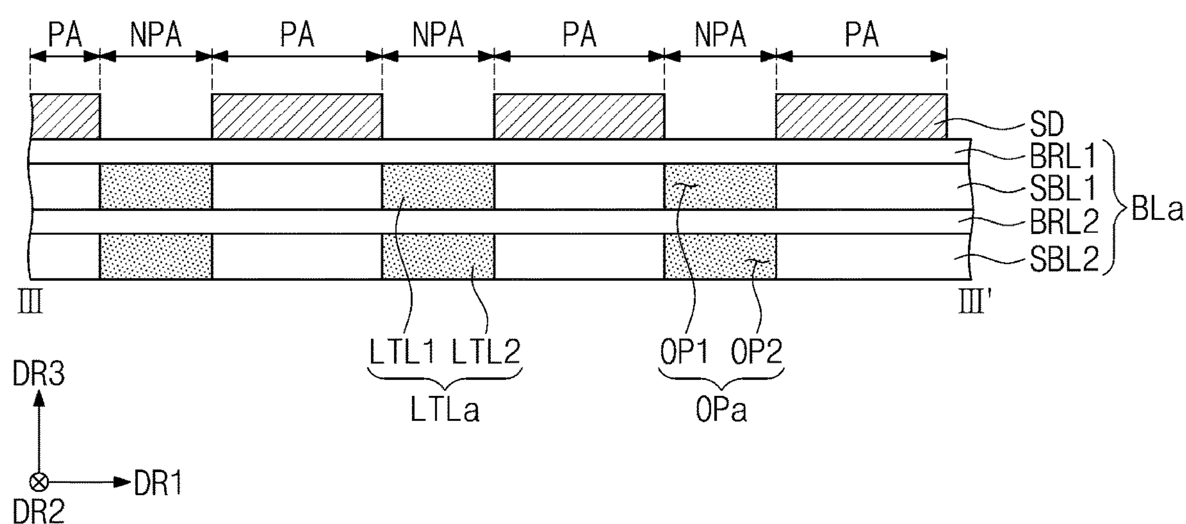
FIG. 8B is a schematic cross-sectional view taken along line III-III' of FIG. 8A.

FIG. 8A is a perspective view illustrating a portion of the display panel according to an embodiment of the disclosure. FIG. 8B is a schematic cross-sectional view taken along line III-III' of FIG. 8A. Hereinafter, contents duplicated with those described above will be omitted.

Referring to FIGS. 8A and 8B, a base layer BLa of a display panel DPa according to an embodiment may include multiple layers. For example, the base layer BLa may include a first barrier layer BRL1 disposed under the display pads SD, a first sub base layer SBL1 disposed under the first barrier layer BRL1, a second barrier layer BRL2 disposed under the first sub base layer SBL1, and a second sub base layer SBL2 disposed under the second barrier layer BRL2. In FIG. 8B, the base layer BLa is illustrated as including four layers, but the disclosure is not limited thereto, and the base layer BLa may include only two layers or a multi-layer structure of four or more layers.

Each of the first barrier layer BRL1 and the second barrier layer BRL2 may include an inorganic material. For example, each of the first barrier layer BRL1 and the second barrier layer BRL2 may include silicon oxide. Each of the first barrier layer BRL1 and the second barrier layer BRL2 may protect a circuit element layer DP-CL and a display element layer DP-OLED, which are disposed on the base layer BLa, from foreign substances such as moisture, oxygen, and dust particles.

Each of the first sub base layer SBL1 and the second sub base layer SBL2 may include a synthetic resin. For example, each of the first sub base layer SBL1 and the second sub base layer SBL2 may include a polyimide (PI) material. Each of the first sub base layer SBL1 and the second sub base layer SBL2 may be a transparent or opaque polyimide film.

Each of the first sub base layer SBL1 and the second sub base layer SBL2 may be disposed to overlap the pad area PA and may be disposed so as not to overlap the non-pad area NPA in a plan view. For example, an opening OPa may be defined in the non-pad area NPA of each of the first sub base layer SBL1 and the second sub base layer SBL2 of the base layer BLa. Each of the first barrier layer BRL1 and the second barrier layer BRL2 may be disposed to overlap the pad area PA and the non-pad area NPA in a plan view. For example, no opening may be defined in each of the first barrier layer BRL1 and the second barrier layer BRL2 of the base layer BLa.

The opening OPa may include first openings OP1 defined in the first sub base layer SBL1 and second openings OP2 defined in the second sub base layer SBL2. A light transmission layer LTLa may be disposed in the opening OPa. For example, the light transmission layer LTLa may include a first light transmission layer LTL1 disposed in the first openings OP1 and a second light transmission layer LTL2 disposed in the second openings OP2.

Each of the first openings OP1 may be defined to entirely overlap each of the non-pad areas NPA in a plan view. Each of the first openings OP1 may be a hole defined in the first sub base layer SBL1. The first light transmission layer LTL1 disposed in each of the first openings OP1 may overlap the non-pad areas NPA and may not overlap the pad areas PA in a plan view.

Each of the second openings OP2 may be defined to entirely overlap each of the non-pad areas NPA in a plan view. Each of the second openings OP2 may be a hole defined in the second sub base layer SBL2. The second light transmission layer LTL2 disposed in each of the second openings OP2 may overlap the non-pad areas NPA and may not overlap the pad areas PA in a plan view. The second light transmission layer LTL2 may overlap the first light transmission layer LTL1 in a plan view.

According to an embodiment of the disclosure, each of the first light transmission layer LTL1 and the second light transmission layer LTL2 may have a light transmittance greater than or equal to about 60%. For example, each of the first light transmission layer LTL1 and the second light transmission layer LTL2 may transmit in a range of about 80% to about 95% of light in case that ultraviolet (UV) light having a wavelength in a range of about 300 nm to about 400 nm is provided. Each of the first light transmission layer LTL1 and the second light transmission layer LTL2 may include a polymer material capable of transmitting ultraviolet (UV) light.

A thickness of the first barrier layer BRL1 and a thickness of the first sub base layer SBL1 may be different from each other. The thickness of the first sub base layer SBL1 may be greater than the thickness of the first barrier layer BRL1. For example, the thickness of the first sub base layer SBL1 may be in a range of about 5 μm to about 15 μm, and the thickness of the first barrier layer BRL1 may be in a range of about 0.3 μm to about 0.7 μm. Descriptions of the second barrier layer BRL2 and the second sub base layer SBL2 are the same as those of the first barrier layer BRL1 and the first sub base layer SBL1.

Since each of the first barrier layer BRL1 and the second barrier layer BRL2 has a thin thickness in a range of about 0.3 μm to about 0.7 μm, in case that a space is formed under the first barrier layer BRL1 and the bottom of the second barrier layer BRL2, the first barrier layer BRL1 and the second barrier layer BRL2 may collapse. For example, in case that the first light transmission layer LTL1 is not disposed on the first openings OP1, and the second light transmission layer LTL2 is not disposed on the second openings OP2, each of the first barrier layer BRL1 and the second barrier layer BRL2 may be disconnected at a portion overlapping the first openings OP1 and the second openings OP2 due to gravity. According to an embodiment of the disclosure, as the first light transmission layer LTL1 is disposed in the first openings OP1, and the second light transmission layer LTL2 is disposed in the second openings OP2, a height difference between the first barrier layer BRL1 and the second barrier layer BRL2 may be disappeared, resulting in preventing the first barrier layer BRL1 and the second barrier layer BRL2 overlapping the non-pad regions NPA from being disconnected due to the height difference. Therefore, the reliable display device DD (see FIG. 1) may be provided.

Figure 9A:
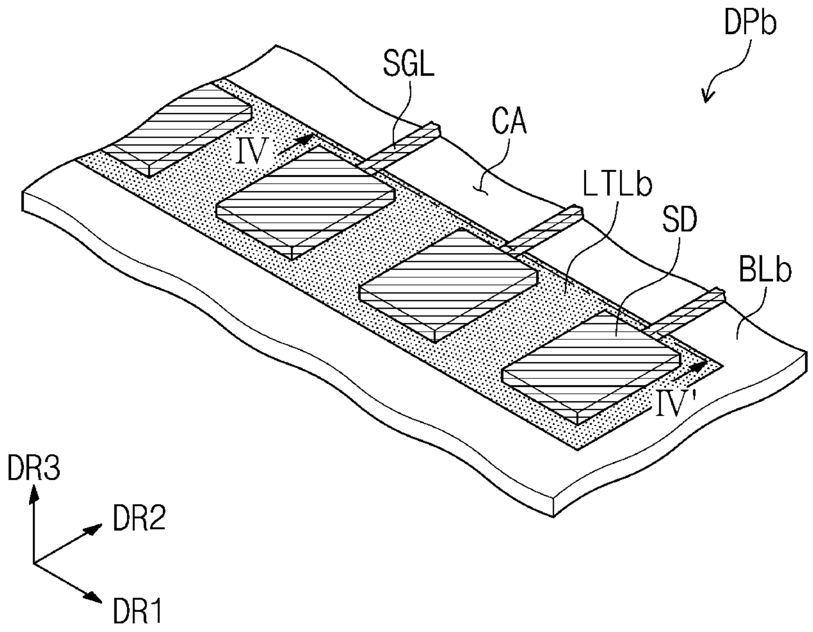
FIG. 9A is a perspective view illustrating a portion of the display panel according to an embodiment of the disclosure.
Figure 9B:
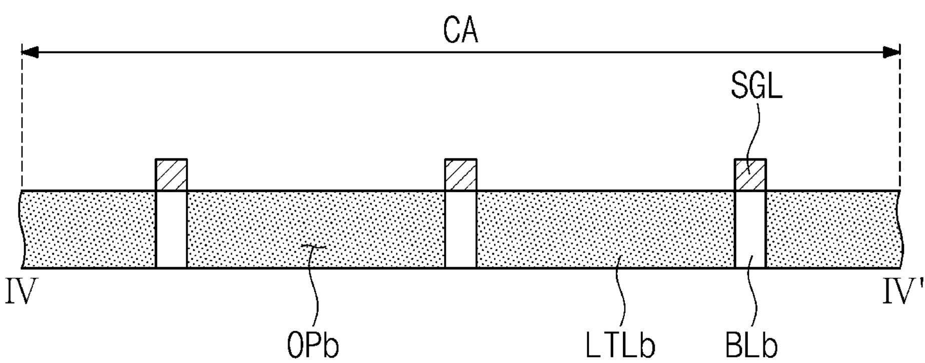
FIG. 9B is a schematic cross-sectional view taken along line IV-IV' of FIG. 9A.

FIG. 9A is a perspective view illustrating a portion of the display panel according to an embodiment of the disclosure. FIG. 9B is a schematic cross-sectional view taken along line IV-IV' of FIG. 9A.

Referring to FIGS. 9A and 9B, a single opening OPb may be defined in a base layer BLb. For example, the opening OPb may partially overlap display pads SD and multiple signal lines SGL in a connection area CA in a plan view. A light transmission layer LTLb may be disposed in the opening OPb. For example, the light transmission layer LTLb may partially overlap the display pads SD and the signal lines SGL in a plan view.

According to an embodiment of the disclosure, the light transmission layer LTLb may be disposed to surround the entire display pads SD in a plan view. As the light transmission layer LTLb is disposed to surround the entire display pads SD a plan view, the light transmitted through the light transmission layer LTLb may be provided to a conductive adhesive member ACF (see FIG. 6) so that efficient photocuring is performed.

Figure 10A:
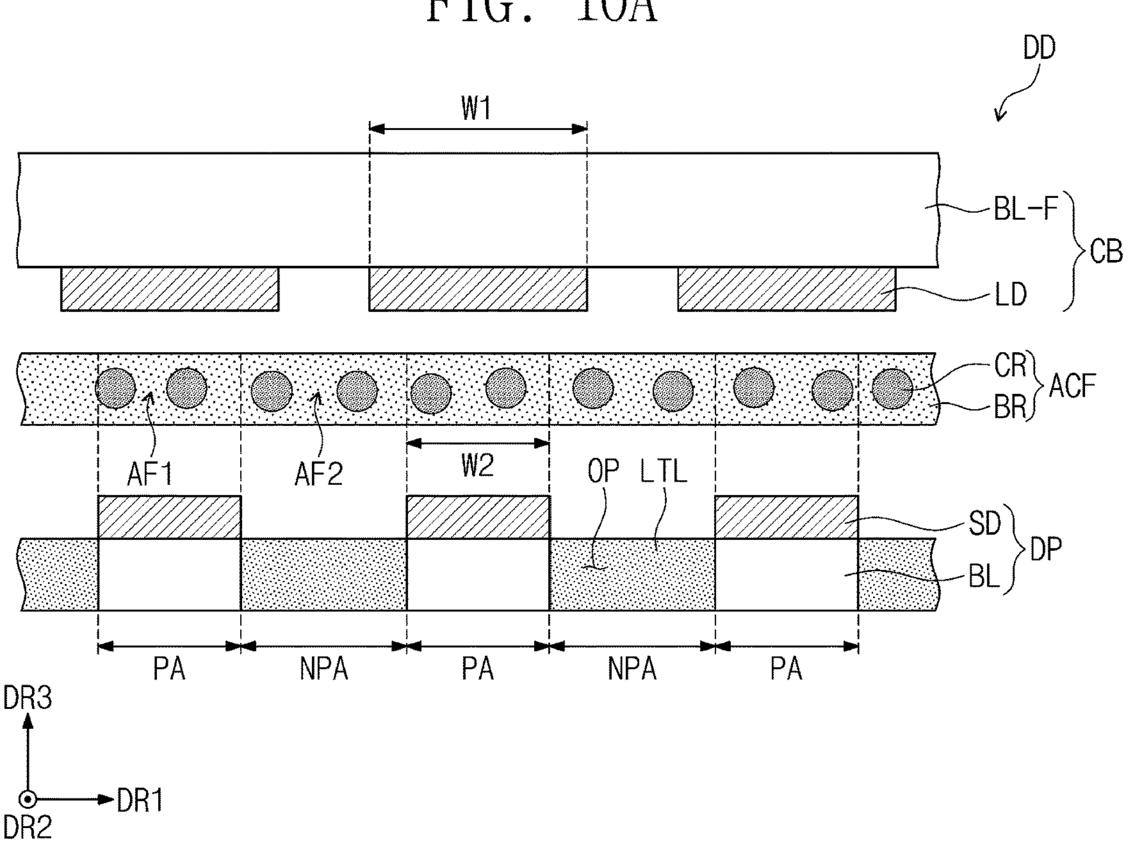
FIG. 10A is a schematic cross-sectional view illustrating a portion of the display device according to an embodiment of the disclosure.
Figure 10B:
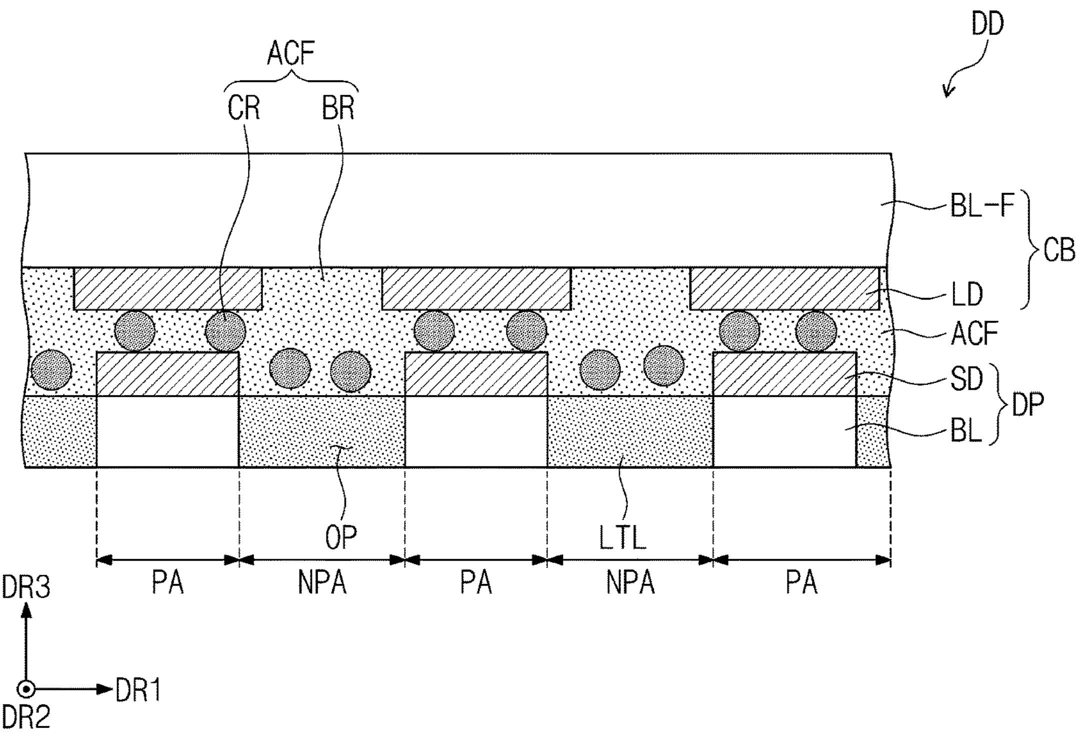
FIG. 10B is a schematic cross-sectional view illustrating a portion of the display device according to an embodiment of the disclosure.

FIG. 10A is a schematic cross-sectional view illustrating a portion of the display device according to an embodiment of the disclosure. FIG. 10B is a schematic cross-sectional view illustrating a portion of the display device according to an embodiment of the disclosure. Particularly, FIG. 10A is a schematic exploded cross-sectional view of the display device before the display panel DP and the circuit board CB are attached through the conductive adhesive member ACF. FIG. 10B is a schematic exploded cross-sectional view of the display device DD after the display panel DP and the circuit board CB are attached through the conductive adhesive member ACF.

Referring to FIGS. 10A and 10B, the display device DD may include a display panel DP, a conductive adhesive member ACF, and a circuit board CB. FIG. 10A schematically illustrates a cross-section in which the display panel DP, the conductive adhesive member ACF, and the circuit board CB are disassembled and spaced apart from each other, and FIG. 10B schematically illustrates a state in which the display panel DP, the conductive adhesive member ACF, and the circuit board CB are coupled to each other. For example, in the display device DD according to an embodiment of the disclosure, at least a portion of the display panel DP may be in contact with the conductive adhesive member ACF, and at least a portion of the circuit board CB may be in contact with the adhesive member ACF. The conductive adhesive member ACF may be disposed between the display panel DP and the circuit board CB to electrically connect the display panel DP to the circuit board CB. The conductive adhesive member ACF may electrically connect the circuit pads LD to the display pads SD.

The conductive adhesive member ACF may include multiple conductive balls CR and an adhesive resin BR in which the conductive balls CR are dispersed. In case that the conductive adhesive member ACF is compressed between the circuit board CB and the display panel DP, the conductive balls CR aligned in the first direction DR1 may electrically connect the circuit pads LD of the circuit board CB to the display pads SD of the display panel DP. The conductive adhesive member ACF may be an anisotropic conductive film (ACF).

According to an embodiment of the disclosure, the conductive adhesive member ACF may include a photoinitiator. The conductive adhesive member ACF may include a base resin and a photoinitiator. The conductive adhesive member ACF may be a photocurable resin layer. For example, the conductive adhesive member ACF may be made of an ultraviolet (UV) curable resin. The conductive adhesive member ACF may be activated by light and cured by the light. For example, the conductive adhesive member ACF may be a resin layer curable by the ultraviolet light having a wavelength in a range of about 300 nm to about 400 nm. The conductive adhesive member ACF may be a member having adhesive strength as the conductive adhesive member ACF is cured by the irradiated light during manufacturing the display device DD according to an embodiment of the disclosure.

During manufacturing the display device DD, the irradiated light may be provided to the conductive adhesive member ACF by passing through the light transmission layer LTL disposed in the openings OP. In the display device DD according to an embodiment of the disclosure, the light transmission layer LTL having high light transmittance may be disposed in the openings OP, and thus, a portion of the light provided to the display device DD may pass through the display panel DP to efficiently cure the conductive adhesive member ACF. For example, in case that the light is irradiated to the display device DD for about 2 seconds, about 97% of the conductive adhesive member ACF may be cured.

The conductive adhesive member ACF may include a pad-adhesive part AF1 disposed to overlap the pad area PA and a non-pad-adhesive part AF2 disposed to overlap the non-pad area NPA in a plan view. In case that the light is irradiated during the manufacture of the display device DD according to an embodiment of the disclosure, the pad-adhesive part AF1 may be cured by reflected or diffracted light, and the non-pad-adhesive part AF2 may be cured by direct light.

The circuit board CB may include a circuit base layer BL-F and multiple circuit pads LD disposed on the circuit base layer BL-F. The circuit board CB illustrated in FIGS. 10A and 10B may represent any one of the above-described printed circuit board CF (see FIG. 6) and the above-described driving chip DC (see FIG. 6).

The circuit base layer BL-F may include a flexible material. For example, the circuit base layer BL-F may be a polyimide film having flexible properties. The circuit base layer BL-F may be a transparent or opaque polyimide film.

The circuit pads LD may be disposed on the circuit base layer BL-F. The circuit pads LD illustrated in FIGS. 10A and 10B may be any one of the substrate pads CF-PD (see FIG. 6) mounted on the above-described printed circuit board CF (see FIG. 6) and the chip pads DC-PD (see FIG. 6) mounted on the driving chip DC (see FIG. 6).

The circuit pads LD of the circuit board CB may correspond to the display pads SD of the display panel DP. A pitch between the adjacent circuit pads LD in the first direction DR1 and a pitch between the adjacent display pads SD in the first direction DR1 may be the same. A width W1 of each of the circuit pads LD in the first direction DR1 may be greater than a width W2 of each of the display pads SD in the first direction DR1. For example, each of the circuit pads LD may be disposed to partially overlap each of the pad areas PA of the display panel DP in a plan view. Since the width W2 of each of the display pads SD is relatively less than the width W1 of each of the circuit pads LD, a width of the pad-adhesive part AF1 in the first direction DR1 may be relatively less than the width W1 of each of the circuit pads LD. Therefore, during the display device DD is manufactured, the amount of light reaching the pad-adhesive part AF1 may increase, and photocuring and adhesion of the pad-adhesive part AF1 may be improved to improve the reliability of the display device DD.

In the display device according to the disclosure, as the light transmission layer having a high transmittance is disposed in the opening defined in the base layer, the reliability in photocuring of the photocurable adhesive member disposed between the display panel and the circuit board may be improved.

As the light transmission layer is disposed in each of the openings defined in the base layer including multiple layers, the phenomenon in which the barrier layer included in the base layer is disconnected may be prevented. Therefore, the display device having the improved reliability may be provided.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:

a circuit board comprising a plurality of circuit pads;

a display panel comprising a plurality of pad areas and a plurality of non-pad areas alternately arranged in a direction; and a conductive adhesive member that electrically connects the circuit board to the display panel, wherein the display panel further comprises:

a base layer comprising a plurality of openings, which overlap the plurality of non-pad areas in a plan view, respectively;

a light transmission layer disposed in each of the plurality of openings and having a light transmittance greater than a light transmittance of the base layer; and a plurality of display pads which correspond to the plurality of circuit pads and are arranged in the direction to overlap the plurality of pad areas in a plan view, respectively;

wherein the base layer further comprises:

a first barrier layer disposed below the display pads; and a first sub base layer disposed below the first barnier laver, wherein the first barrier layer is disposed to overlap the plurality of pad areas and the plurality of non-pad areas in a plan view, and the first sub base layer comprises first openings arranged to respectively overlap the plurality of non-pad areas in a plan view.

2. The display device of claim 1, wherein the plurality of openings are arranged in the direction and do not overlap the plurality of pad areas in a plan view.

3. The display device of claim 1, wherein the light transmission layer is in direct contact with an opening surface of the base layer, which defines the plurality of openings.

4. The display device of claim 3, wherein the light transmission layer is filled in the plurality of openings.

5. The display device of claim 1, wherein the light transmission layer is filled in the first openings.

6. The display device of claim 1, wherein the base layer further comprises:

a second barrier layer disposed below the first sub base layer; and a second sub base layer disposed below the second barrier layer, wherein the second barrier layer is disposed to overlap the plurality of pad areas and the plurality of non-pad areas in a plan view, and the second sub base layer comprises second openings corresponding to the first openings.

7. The display device of claim 6, wherein the light transmission layer is filled in the second openings.

8. The display device of claim 6, wherein each of the first sub base layer and the second sub base layer comprises a polyimide (PI) material.

9. The display device of claim 1, wherein the light transmission layer comprises a polymer material that transmits ultraviolet light.

10. The display device of claim 9, wherein the light transmission layer has the light transmittance in a range of about 80% to about 95%.

11. The display device of claim 1, wherein a pitch of each of the plurality of display pads in the direction and a pitch of each of the plurality of circuit pads in the direction are same.

12. The display device of claim 1, wherein a width of each of the plurality of display pads in the direction is less than a width of each of the plurality of circuit pads in the direction.

13. The display device of claim 1, wherein the conductive adhesive member comprises a photoinitiator.

14. A display device comprising:

a circuit board comprising a plurality of circuit pads;

a display panel comprising a plurality of pad areas arranged in a first direction and extending in a second direction intersecting the first direction and a non-pad area adjacent to the plurality of pad areas; and a conductive adhesive member that electrically connects the circuit board to the display panel, wherein the display panel further comprises:

a base layer comprising a plurality of layers and an opening defined in at least one of the plurality of layers;

a light transmission layer disposed in the opening and having a light transmittance greater than a light transmittance of the base layer; and a plurality of display pads which correspond to the plurality of circuit pads and arranged in the first direction to overlap the plurality of pad areas in a plan view, respectively, wherein the non-pad area includes a plurality of non-pad areas, and the plurality of non-pad areas and the plurality of pad areas are alternatively arranged in the first direction;

wherein the plurality of layers comprise:

a first barrier layer disposed below the display pads; and a first sub base layer disposed below the first barrier layer, wherein the first barrier layer is disposed to overlap the plurality of pad areas and the plurality of non-pad areas in a plan view, and the first sub base layer comprises first openings arranged to respectively overlap the plurality of non-pad areas in a plan view.

15. The display device of claim 14, wherein the light transmission layer is filled in the first openings.

16. The display device of claim 14, wherein the base layer further comprises:

a second barrier layer disposed below the first sub base layer; and a second sub base layer disposed below the second barrier layer, wherein the second barrier layer is disposed to overlap the plurality of pad areas and the plurality of non-pad areas in a plan view, and the second sub base layer comprises second openings corresponding to the first openings.

17. The display device of claim 16, wherein the light transmission layer is filled in the second openings.

18. An electronic device comprising:

a display device comprising:

a circuit board comprising a plurality of circuit pads;

a display panel comprising a plurality of pad areas and a plurality of non-pad areas alternately arranged in a direction; and a conductive adhesive member that electrically connects the circuit board to the display panel, wherein the display panel further comprises:

a base layer comprising a plurality of openings, which overlap the plurality of non-pad areas in a plan view, respectively;

a light transmission layer disposed in each of the plurality of openings and having a light transmittance greater than a light transmittance of the base layer; and a plurality of display pads which correspond to the plurality of circuit pads and are arranged in the direction to overlap the plurality of pad areas in a plan view, respectively;

wherein the base layer further comprises:

a first barrier layer disposed below the display pads; and a first sub base layer disposed below the first barrier layer, wherein the first barrier layer is disposed to overlap the plurality of pad areas and the plurality of non-pad areas in a plan view, and the first sub base layer comprises first openings arranged to respectively overlap the plurality of non-pad areas in a plan view.

* * * * *